(12) United States Patent
Chen et al.

(10) Patent No.: US 6,272,660 B1
(45) Date of Patent: Aug. 7, 2001

(54) SCREENING FOR ERRORS IN DATA TRANSMISSION SYSTEMS

(75) Inventors: Brian Chen, Somerville, MA (US); Carl-Erik Wilhelm Sundberg, Chatham, NJ (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/143,911

(22) Filed: Aug. 31, 1998

Related U.S. Application Data

(63) Continuation-in-part of application No. 09/054,677, filed on Apr. 3, 1998, now Pat. No. 6,105,158.

(51) Int. Cl.$^7$ .................................................. H03M 13/03
(52) U.S. Cl. ........................................... 714/794; 714/795
(58) Field of Search ................................... 714/752, 794, 714/795, 796; 375/262, 341; 708/530

(56) References Cited

U.S. PATENT DOCUMENTS

| | | | |
|---|---|---|---|
| 4,742,519 | * 5/1988 | Abe et al. | 714/755 |
| 5,208,816 | 5/1993 | Seshadri et al. | 371/43 |
| 5,355,376 | 10/1994 | Cox et al. | 371/43 |
| 5,537,444 | 7/1996 | Nill et al. | 375/341 |
| 5,740,187 | * 4/1998 | Tanaka | 714/755 |
| 5,812,603 | * 9/1998 | Luthi et al. | 375/287 |
| 6,028,897 | * 2/2000 | Wang | 375/265 |

OTHER PUBLICATIONS

N. Seshardi et al., "List Viterbi Decoding Algorithms With Applications," *IEEE Transactions on Copmmunications*, vol. 42, Feb./Mar./Apr. 1994, pp. 313–323.

C. Nill et al., "List and Soft Symbol Output Viterbi Algorithms: Extensions and Comparisons," *IEEE Transactions on Communications*, vol. 43, Feb./Mar./Apr. 1995, pp. 277–287.

Cox et al., "An Efficient Adaptive Circular Viterbi Algorithm for Decoding Generalized Tailbiting Convolutional Codes," *IEEE Transactions on Vehicular Technology*, vol. 43, No. 1, Feb. 1994, pp. 57–68.

Seshadri et al., "Generalized Viterbi Algorithms for Error Detection with Convolutional Codes," IEEE Global Telecommunications Conference & Exhibition, Dallas, Texas, Nov. 27–30, 1989, pp. 1534–1538.

Clark and Cain, *Error–Correction Coding for digital Communications*, Chapter 6 entitled "Convolutional Code Structure and Viterbi Decoding," 1981, pp. 227–266.

*The Digital Signal Processing Handbook*, CRC Press, 1998, Chapter 56, pp. 56–1–56–14.

*The Digital Signal Processing Handbook*, CRC Press, 1998, Chapter 42, pp. 42–1–42–18.

* cited by examiner

*Primary Examiner*—Christine T. Tu
(74) *Attorney, Agent, or Firm*—Geraldine Monteleone

(57) ABSTRACT

The likelihood of significant errors in a decoded sequence is determined based on at least one criterion that is both extrinsic and intrinsic to the decoded sequence. In particular, this determination is preferably made by comparing a signal corresponding to the decoded sequence with a so-called error mitigation signal.

40 Claims, 7 Drawing Sheets

SCREENING FOR ERRORS IN DATA TRANSMISSION SYSTEMS

CROSS-REFERENCE TO RELATED APPLICATION

This is a continuation-in-part of the U.S. patent application Ser. No. 09/054,677, filed Apr. 3, 1998, now U.S. Pat. No. 6,105,158 entitled "Screening for Undetected Errors in Data Transmission Systems."

BACKGROUND OF THE INVENTION

The present invention relates to data error screening and, in particular embodiments, to screening for errors in systems in which an error mitigation signal may be produced.

In a typical data transmission system, a stream of data bits is encoded in a transmitter and transmitted over a communications channel that exhibits noise, distortion or other impairments. In the receiver, a corrupted version of what was transmitted is operated on by a decoder to generate an output sequence of bits that is determined to be that which most likely corresponds to the stream of bits that was encoded in the transmitter.

In some such systems, the decoded output sequence undergoes some type of "analysis" resulting either in an acceptance of the decoded output sequence as being correct or in an indication of a potential decoding error and hence a rejection of the decoded output sequence. A typical such analysis involves error detection and/or correction using codes well known in the art, such as parity check information that was included in the encoded stream of data bits. If the decoded output sequence corresponding to the transmitted encoded data proves to have the correct parity, it is released for further processing. Otherwise an error flag is released, responsive to which the system may either (a) request a re-transmission of the encoded data or (b) initiate error mitigation routines. In audio data transmission systems, for example, the error mitigation routines may substitute a so-called error mitigation signal for the audio signal corresponding to the decoded sequence. This approach is analogous to a long-standing practice in video transmission systems. See, for example, *The Digital Signal Processing Handbook,* CRC Press, 1998, ch. 56.

The decoder may be capable of identifying more than one output sequence corresponding to the encoded stream of data bits. An example of such a decoder is a so-called List Viterbi decoder which utilizes a List Viterbi algorithm to identify the L best candidate decodings corresponding to the encoded stream of bits. The aforementioned analysis, then, may involve the determination of which, if any, decoded output sequence should be selected for further processing.

For certain transmission systems, such as high quality audio systems, the analysis step is particularly important. Errors in a decoded sequence that would be noticeable to a listener may under certain circumstances- for example, if the errors are few in number and isolated-be mitigated upon being detected. On the other hand, errors in a decoded sequence that are undetected during the analysis step and thus are present in the decoded sequence as it is being further processed by an audio decoder-may be very significant, resulting, for example, in a listener hearing clicks during a pause in a musical selection. In such systems, then, it is desirable to be able to further screen decoded sequences for errors which were undetected in the analysis step.

SUMMARY OF THE INVENTION

In prior art arrangements as just described, the decision as to whether a decoded sequence is acceptable is made by determining the likelihood of significant errors (hereinafter referred to as "error screening" in the decoded sequence based solely on criteria intrinsic to the decoded sequence itself, such as its satisfaction of a parity check. That is, for example, the prior art analysis step is solely a function of the decoded sequence (including information derivable from that sequence). In accordance with the present invention, by contrast, error screening of a decoded sequence is based on at least one criterion that is both extrinsic and intrinsic to the decoded sequence currently being screened. That is, for example, error screening is a function of intrinsic information, i.e., the decoded sequence and/or a function of the decoded sequence, and extrinsic information, i.e., information exclusive of that sequence. This approach, we have found, is likely to lead to an increased number of errors being detected than that detected in prior art arrangements, thereby improving, for example in audio data transmission systems, the overall quality of the audio signal.

More particularly, the error screening criterion may be a comparison between a signal corresponding to the decoded sequence and a so-called error mitigation signal. As is well known, an error mitigation signal is a signal generated in the receiver and used as an estimate of the signal corresponding to the decoded sequence that had been determined to be unacceptable. The error mitigation signal is typically generated from decoded sequences (or other information) other than the decoded sequence to which it is being compared. Thus the comparison between the signal corresponding to the decoded sequence with the error mitigation signal meets the criterion above as being both extrinsic and intrinsic to that decoded sequence.

As a consequence of the comparison, a decision is made as to whether the decoded sequence is applied to an output, illustratively released or used for further processing in the receiver. That is, for example, depending on the results of the comparison, either the decoded sequence is accepted and the signal corresponding to the decoded sequence is applied to an output, or the error mitigation signal is applied. In preferred embodiments, error screening is performed only when most advantageous to do so, for example, if a particular condition indicative of an increased likelihood of undetected errors exists.

There are prior art systems which determine whether a decoded sequence is acceptable. However, that determination is made in these systems by using criteria solely extrinsic to the sequence. That is, the determination is based on information exclusive of the decoded sequence. For example, the receiver may check channel conditions at the time of transmission and may determine that conditions were such that the received symbols are most likely too error-flawed to warrant being decoded. However, since, in fact, no decoding or screening occurs, these systems do not screen for errors contained in a decoded sequence and certainly do not constitute systems in which, per the present invention, such screening is based on at least one criterion that is intrinsic, as well as extrinsic, to that sequence.

The present invention is particularly advantageous in systems, such as audio data transmission systems, in which a List Viterbi decoder is utilized. More specifically, we have realized that while use of a List Viterbi algorithm significantly reduces the so-called error flag rate for digital audio applications, the lower error flag rate motivates the use of such applications in noisier channels where the probability of errors that are undetected by prior art analysis techniques increases. The problem of errors undetected by the Viterbi decoding may be dealt with by including a parity check code, for example, a Cyclic Redundancy Check (CRC) code.

However, there still remains errors undetected by the parity check code, the occurrence of which can be mitigated against by increasing the number of bits in the existing parity check code. Assuming that the channel bandwidth is fixed, this technique leads to a decreased data rate. In contrast, the present invention advantageously lowers the rate of undetected errors that may have a significant impact on decoded signal quality without decreasing the data rate, while engendering only a relatively small amount of increased processing complexity and delay.

In a number of the embodiments described hereinbelow, error screening in a decoded sequence occurs after a preliminary analysis as a result of which that decoded sequence was selected for further processing. However, error screening may in fact also be used in the selection of the decoded sequence in the first instance. For example, in systems utilizing List Viterbi decoding, techniques using principles of the invention may be used to select which of the candidate decodings identified by List Viterbi decoding should be released for further processing.

DETAILED DESCRIPTION

The principles of the present invention have been found to be particularly advantageous when used in digital audio transmission systems and thus are described for the most part in that context. However, it should be understood that the invention is applicable to many other types of systems including, but not limited to, image, video, and speech communication systems.

Figure 1:
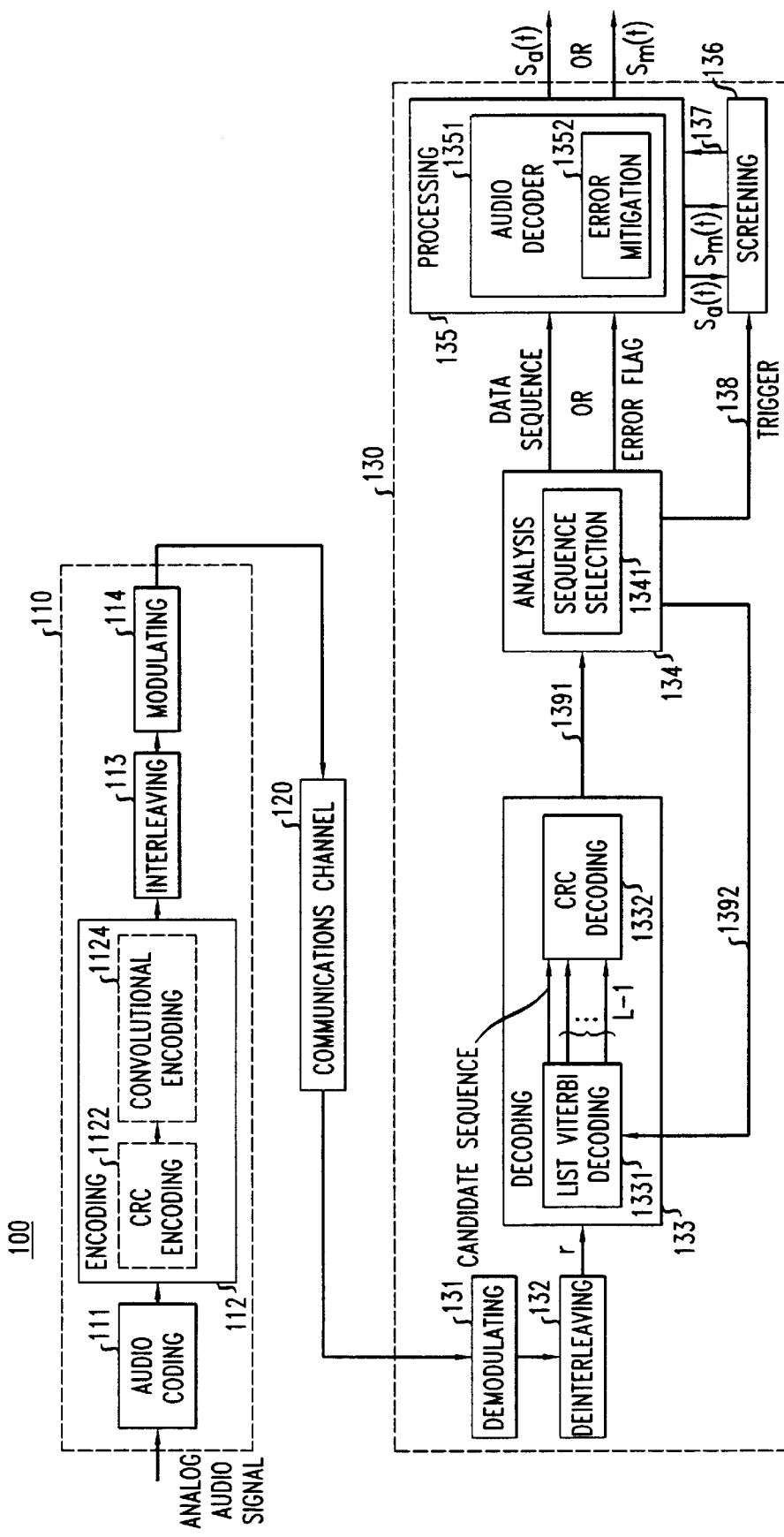
FIG. 1 shows a block diagram of a digital audio transmission system which includes a first illustrative embodiment of the invention, the system utilizing List Viterbi decoding and CRC decoding.

FIG. 1 is a block diagram of a system 100 in which the present invention is illustratively implemented. System 100 includes transmitter 110, communications channel 120 and receiver 130. The various processing elements comprising transmitter 110 and receiver 130 are depicted herein for pedagogic clarity not in terms of specific hardware processing units per se but as functional steps or processes.

Transmitter 110 includes audio coding 111 which generates frames—for example, so-called perceptual audio coder (PAC) frames—of digital data bits from an applied analog audio signal. Such frames may be of variable length and are generated using the techniques described, for example, in *The Digital Signal Processing Handbook,* CRC Press, 1998, ch. 42. Encoding 112 of the digital data bits is then performed by a first, outer encoding, illustratively Cyclic Redundancy Check ("CRC") encoding 1122, and a second, inner encoding, illustratively convolutional encoding 1124. In particular, CRC encoding 1122 appends CRC bits to a selected number of frames or fractions of one or more frames thereby generating CRC blocks. Convolutional encoding 1124 operates on the CRC blocks to generate a sequence of symbols. Interleaving 113 is performed on the convolutionally encoded symbols in a conventional manner. Modulating 114 is performed on the interleaved symbols using standard modulation techniques to generate a channel signal for transmission over communications channel 120. In general, communications channel 120 will exhibit noise, distortion and other impairments.

Receiver 130 includes demodulating 131 which operates on the received signal in a manner complementary to modulating 114 to recover interleaved symbols. Deinterleaving 132 is then performed and the resulting sequence of symbols, r, undergoes decoding 133. Decoding 133 is illustratively comprised of List Viterbi decoding 1331 (wherein the List Viterbi algorithm is implemented) and CRC decoding 1332.

In accordance with the regular Viterbi algorithm, a single candidate decoding is provided as an output, that decoding representing the algorithm's best estimate of what sequence was produced by encoding 112. As is known, the List Viterbi algorithm goes one step further by providing the L best candidate decodings which are the L sequences, in rank order, which have been determined by the algorithm to have the "best" so-called path metrics, L being a selected number greater than one. (The regular Viterbi algorithm is used if L were equal to one.) Different versions of the List Viterbi algorithm are known in the art. For example, the so called parallel List Viterbi algorithm simultaneously identifies all L best candidate decodings. This is in contrast to the so-called serial List Viterbi algorithm, used herein in certain embodiments, which initially provides the first best candidate decoding and, upon request, provides the second best and so on. This capability is exploited in a manner that will be described shortly. For further details of List Viterbi decoding, see, for example, N. Seshadri and C-E. Sundberg, "List Viterbi Decoding Algorithms with Applications," *IEEE Transactions on Communications,* vol. 42, pp. 311–23, February/March/April 1994 and C. Nill and C-E. W. Sundberg, "List and Soft Symbol Output Viterbi Algorithms: Extensions and Comparisons," *IEEE Transactions on Communications,* vol. 43, pp. 277–87, February/March/April 1995.

List Viterbi decoding 1331 is performed on sequence r—typically a corrupted version of the sequence generated by encoding 112—as the decoding counterpart to convolutional encoding 1122 and provides to CRC decoding 1332 the first best candidate decoding, or sequence. As will be discussed more fully below, the outcome of CRC decoding 1332 is provided on lead 1391 to analysis 134.

Analysis 134 may involve any of a number of present or future techniques based solely on criteria intrinsic to a particular decoded sequence to determine whether the likelihood of potential errors is such that the particular decoded sequence should either be accepted as correct or rejected. More specifically, such criteria are either inherent within or derivable from the decoded sequence and is based on, for instance, the parity of the sequence or a signal generated by subjecting the decoded sequence to an audio encoding operation. A typical analysis may include, for example, one of the following: a) error correction, b) error detection, or c) a combination of error correction or error detection. Moreover, if the decoding is capable of identifying more than one output sequence corresponding to the encoded stream of data bits—as in List Viterbi decoding—the analysis may involve the selection of which, if any, decoded output sequence should be accepted.

Analysis 134 in FIG. 1 illustratively implements sequence selection 1341 based on which highest-ranked candidate sequence satisfies the CRC. Responsive to the first best candidate sequence provided by List Viterbi decoding 1331, CRC decoding 1332 provides on lead 1391 either a data sequence—which is the first best candidate sequence stripped of its CRC bits—if the candidate sequence was found to satisfy the CRC or an indication that the CRC was not satisfied. In the former case, sequence selection 1341 passes that data sequence to processing 135 as the best estimate for the sequence generated by encoding 112. In the latter case, sequence selection 1341 requests via lead 1392 that List Viterbi decoding 1331 provide the second best candidate sequence to CRC decoding 1332. If the second best candidate sequence fails to satisfy the CRC, sequence selection 1341 requests that the third best candidate sequence be provided and so forth until one, if any, of the L sequences identified by List Viterbi decoding 1331 satisfies the CRC. Sequence selection 1341 thereupon passes the resultant CRC-decoded data sequence to processing 135. If none of the L sequences identified by List Viterbi decoding 1331 is found to satisfy the CRC, sequence selection 1341 passes an error flag to processing 135.

Thus, processing 135, illustratively shown as comprising audio decoding 1351, receives either a CRC-decoded data sequence or an error flag. Depending on the specific transmission system, the presence of an error flag may indicate that a re-transmission of the data should be requested. In the present context, however, re-transmission is not possible. Rather, the receiver responds to the error flag by invoking error mitigation routines 1352 (included in audio decoding 1351) in which a so-called error mitigation signal is substituted for the signal corresponding to the decoded sequence being processed that was found to be unacceptable. As will become clear in the following discussion, the error mitigation signal typically is generated using information extrinsic to the decoded sequence being processed. The use of an error mitigation signal when an error flag is generated provides a degradation of the signal that is generally less noticeable to a listener than would be the case if the signal corresponding to the decoded sequence were to be used.

Audio decoding 1351 releases an analog audio signal which is either (a) error mitigation signal $s_m(t)$ if an error flag was generated or, (b) the analog audio signal, $s_a(t)$, corresponding to the provided CRC-decoded data sequence and therefore the best estimate of the original audio signal. As discussed earlier, the provided data sequence had been determined to be acceptable by analysis performed solely using criteria intrinsic to the sequence, namely the data and CRC bits in the decoded sequence. However, there always remains some possibility that errors will not be detected during the analysis. For example, the occurrence of multiple errors within a sequence may cause the CRC to be satisfied. Thus, these errors would remain undetected and would be passed to the audio decoder, potentially causing significant audible signal degradation such as, for example, clicks during a pause in a musical selection.

In accordance with the invention, a further step in addition to the analysis is taken to lessen the likelihood that a decoded sequence having an error is applied to an output, i.e., released or used for further processing in the receiver. Having already utilized in the analysis criteria intrinsic to the decoded sequence, a determination of the likelihood of significant errors (hereinafter referred to as "error screening") undetected by such an analysis is nonetheless made using at least one criterion that is both intrinsic and extrinsic to the decoded sequence currently being screened. In preferred embodiments, the decoded output sequence is screened for errors using an error mitigation signal generated by the system—illustratively by comparing the two—and error mitigation is thereupon undertaken if the results of the comparison indicate a strong likelihood that the decoded sequence contains errors. Improved output signal quality is thereby provided.

In the embodiment of FIG. 1, then, once a decoded data sequence has been released for processing 135, the latter generates the corresponding audio data signal $s_a(t)$ as well as an appropriate error mitigation signal $s_m(t)$. Those two signals are provided to screening 136, which then screens audio data signal $s_a(t)$ for errors by comparing it with error mitigation signal $s_m(t)$ in a manner described hereinbelow.

Error mitigation signals as used in such systems are generated based on the fact that analog audio signals invariably include a significant amount of redundancy. As a result, redundancy exists among the resultant audio coder frames which, as discussed above, are comprised of digital data bits and may be of variable length. For these systems, the creation of an error mitigation signal relies on that redundancy and, consequently, an error mitigation signal is typically generated on an audio coder frame basis, that is, generated for a time duration coextensive with the time duration corresponding to a particular audio coder frame.

There are various techniques for generating an error mitigation signal for a particular audio coder frame, the most common being by either, or a combination of, prediction or interpolation from audio coder frames that occur in close time proximity to that particular audio coder frame. Such techniques exploit the inherent redundancy that exists between proximate audio coder frames, thereby allowing the audio decoder to regenerate the digital bits corresponding to the audio coder frame for which error mitigation is needed. If the system can tolerate delay, the audio decoder may interpolate the bits comprising the frame to be mitigated from both previously and later occurring, proximate audio coder frames. Otherwise, the audio decoder uses only earlier, proximate frames to predict the frame to be mitigated. (If, for whatever reason, an appropriate error mitigation signal can not be generated, the best approach may be, for example, to either mute the signal or allow the error (e.g., a click in the music) to occur.)

Other techniques for generating an error mitigation signal include, for hybrid In Band On Channel (IBOC) systems, the so-called blending in of the analog signal corresponding to the audio coder frame to be mitigated. If "multidescriptive coding" is used in a system, an error mitigation signal may be generated using a number of different, but equivalent, versions of the audio frame which are received over two or more channels.

It can be appreciated from the foregoing that the error mitigation signal is generated from information not solely intrinsic to the decoded sequence being processed. Thus the comparison with the error mitigation signal performed in the error screening of a decoded sequence is a criterion that is both intrinsic and extrinsic to that decoded sequence.

Although error mitigation signals are typically generated on an audio coder frame basis, a decoder, on the other hand, may operate on blocks of encoded data, each block corresponding to any number of audio coder frames, or fractions of audio coder frames, as discussed earlier. This difference arises out of the nature of the audio coding algorithms on one hand and the Viterbi decoding algorithms on the other hand. In addition, errors may propagate from one block to another, but typically do not propagate from one audio coder frame to another. These facts need to be taken into account in performing error screening. More specifically, the error mitigation signal $s_m(t)$ and the signal with which it is compared—namely, $s_a(t)$, the signal corresponding to the decoded sequence being processed—must represent the same audio coder frame(s) or fraction(s) thereof. That is, the signals should be compared over the same time interval.

This may be achieved in different ways, some of which require that delay can be tolerated as in, for example, music reproduction or audio broadcast systems. Thus, if a decoded block pertains to only part of a specific audio coder frame, the comparison may be between the signal corresponding to the decoded block and the portion of the error mitigation signal that represents that part of the specific audio coder frame. On the other hand, the comparison may be between an error mitigation signal generated for a specific audio coder frame and the signal corresponding to the decoded block(s) or the portions(s) thereof that represent that specific audio coder frame. Accordingly, it is possible that the decoded sequence currently being processed may in fact be a portion of the decoded block generated by the decoder, rather than the entire decoded block.

Figure 2:
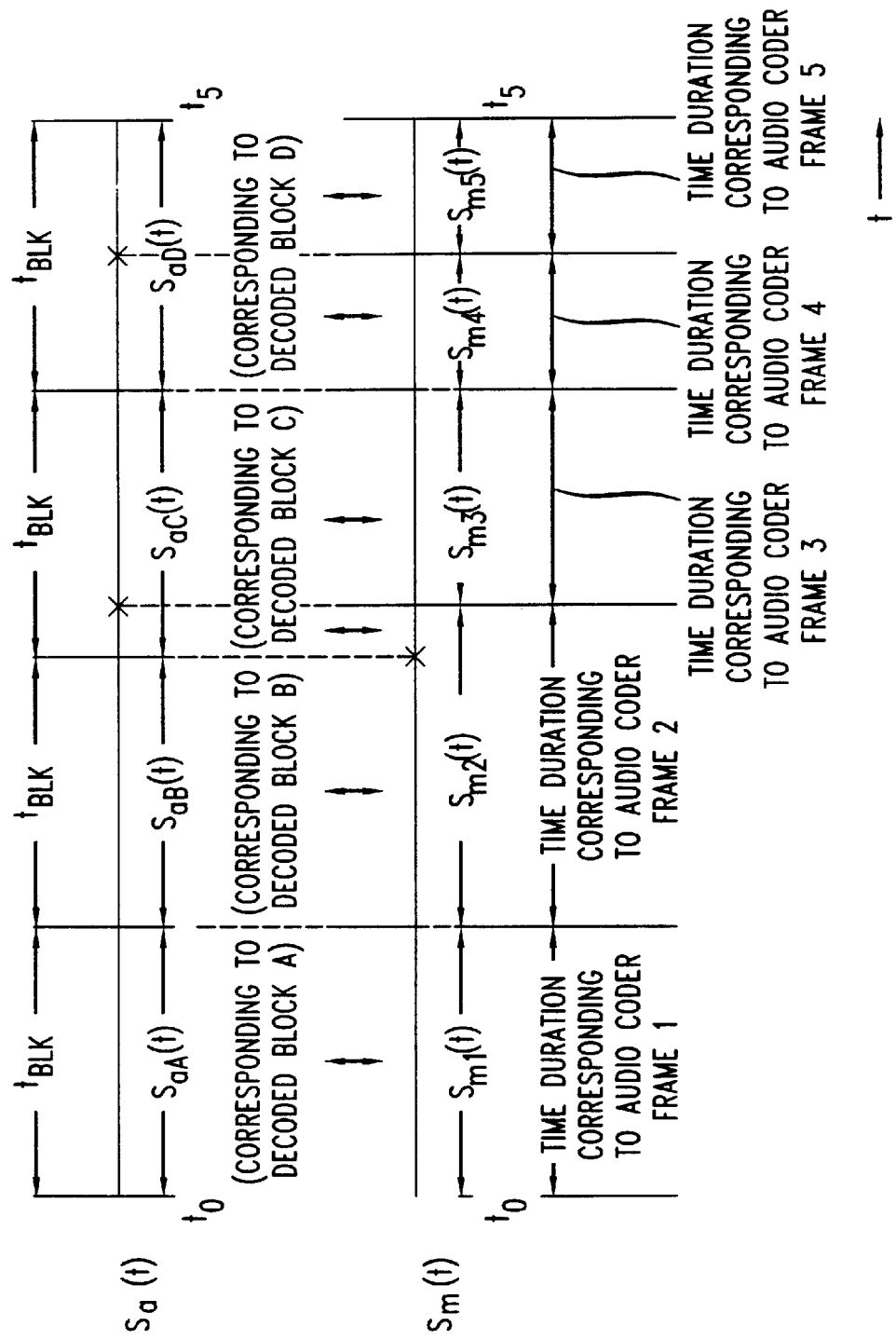
FIG. 2 shows a diagram usefull in explaining how signals corresponding to decoded sequences may be compared to an error mitigation signal.

FIG. 2 is useful in explaining how comparisons with the error mitigation signal may be made. These comparisons are represented in the FIG. by double-headed arrows.

The line labeled $s_a(t)$ shows signals, $s_{aA}(t)$ through $s_{aD}(t)$, generated by subjecting decoded blocks A through D, respectively, to an audio encoding process. Since the decoded blocks are of the same length, each signal has the same time duration, $t_{BLK}$. The signals extend collectively from time $t_0$ to time $t_5$.

The line labeled $s_m(t)$ shows five error mitigation signals, $s_{m1}(t)$ through $s_{m5}(t)$, generated for audio coder frames 1 through 5, respectively. The time duration of each signal is coextensive with the time duration corresponding to its respective audio coder frame. These signals also extend collectively from time $t_0$ to time $t_5$.

In order to simplify the discussion, it is assumed that in the receiver audio coder frames 1 through 5 were encoded into four blocks corresponding to decoded blocks A through D. Specifically, audio coder frame 1 corresponds to decoded block A; audio coder frame 2 corresponds decoded block B and a first portion of decoded block C; audio coder frame 3 corresponds to the second portion of decoded block C; audio coder frame 4 corresponds to a first portion of decoded block D; and audio coder frame 5 corresponds to the second portion of decoded block D.

Thus, error screening of decoded block A comprises the comparison of the signal $s_{aA}(t)$ with error mitigation signal $s_{m1}(t)$.

Error screening of decoded block B comprises the comparison of signal $s_{aB}(t)$ with the first part of the error mitigation signal $s_{m2}(t)$.

Error screening of decoded block C comprises (1) a comparison between the first part of signal $s_{aC}(t)$ corresponding to a first portion of decoded block C—that first portion of decoded block C referred to herein as the decoded sequence being processed—with the corresponding second part of signal $s_{m2}(t)$, and (2) a comparison between the second part of signal $s_{aC}(t)$ corresponding to the second portion of decoded block C—that second portion of decoded block C now being the decoded sequence being processed—and signal $s_{m3}(t)$.

Finally, error screening of decoded block D comprises (1) a comparison between the first part of signal $s_{aD}(t)$ that corresponds to a first portion of decoded block D—that first portion of decoded block D being the decoded sequence being processed—with signal $s_{m4}(t)$, and (2) a comparison between the second part of signal $s_{aD}(t)$ that corresponds to the second portion of decoded block B—that second portion of decoded block B now being the decoded sequence being processed—and signal $s_{m5}(t)$.

Alternatively, the above screenings may be performed by comparing the error mitigation signal for a particular audio coder frame with the signal corresponding to the block(s) or portion(s) thereof that represent that audio coder frame.

Having discussed what signals, or portions thereof, are compared, attention is now directed to how the signals may be compared and the likelihood of significant errors determined.

One way to compare the decoded signal and the mitigation signal is to perform a time domain analysis in which it is determined whether the integral of square of their difference over an interval of one audio coder frame is greater than a threshold value, that is, $$\int (s_a(t) - s_m(t))^2 dt > T_t, \quad (1)$$

where $T_t$ is a threshold value in the time domain. [In practical systems, the integration in this and the following equations will be approximately calculated by means of standard signal processing algorithms.] Referring back to FIG. 1, if inequality (1) is met—that is, the integral value is greater than the threshold value $T_t$—then $s_a(t)$ is regarded as likely to contain significant errors. Accordingly, screening 136 signals to audio decoding 1351 via a particular value of screening flag 137 that $s_m(t)$ should be released by the system in place of $s_a(t)$. Otherwise, screening 136 signals via another value of screening flag 137 that $s_a(t)$ should be released by the system as the most likely estimate of the original audio signal. An alternative to inequality (1) is to perform the comparison in the frequency domain, i.e., $$\int (S_a(f) - S_m(f))^2 df > T_f, \quad (2)$$

where $T_f$ is a threshold value in the frequency domain and where $S_a(f)$ and $S_m(f)$ are frequency representations of $s_a(t)$ and $s_m(t)$, respectively.

The comparison of inequality (2) may be modified to reflect human listeners' perception. For example, certain frequencies may be emphasized over others by using a weighting function, $W(f)$, as in $$\int [W(f)(S_a(f) - S_m(f))]^2 df > T_w, \quad (3)$$

where threshold value $T_w$ and weighting function $W(f)$ are experimentally established. An analogous approach can be taken in the time domain. In more advanced systems, the weighting function may be a function of the signal $s_a(f)$. Additionally, the threshold value $T_w$ may also be a function of the signal $s_a(f)$ following the general approach described hereinbelow for $T_t$.

More particularly, in preferred embodiments, the threshold $T_t$ is related to the statistics of the signals over a short term. The value of this "adaptive" threshold is continuously updated, for example, depending on the dynamics of signal $s_a(t)$ in terms of its signal energy level. Moreover, if there is much variation in the signal energy of $s_a(t)$ in the short-term, it may be desirable to suspend the screening. On the other hand, it would be particularly advantageous to perform the screening if, for example, there was little variation in the short-term audio signal energy.

Such an adaptive threshold may be established by averaging the difference between signals $s_a(t)$ and $s_m(t)$, that is, $$T_t = \tau_t \bullet \overline{(S_a(t) - S_m(t))^2}$$

where the overbar refers to short term averaging of the difference of the error signals over a number $N_1$ (e.g., 100) of consecutive audio coder frames and $\tau_t$ is an experimentally established, normalized fixed numerical value. Alternatively, the threshold may be established based only on $s_a(t)$ as in, $$T_t = \tau_t' \bullet \overline{s_a(t)^2}$$

where $\tau_t'$ is an experimentally established, normalized fixed numerical value.

For certain known types of digital audio broadcasting systems, there is yet another way to establish an adaptive threshold. In these systems, there is a data channel in parallel with the audio transmission. On this data channel, parameters for configuring the receiver (for example, reflecting the type of music that will be received) may be transmitted and thus in turn may be used in establishing the threshold value.

Depending on how the threshold value is established, it may be possible for "false alarms" to occur, that is, situations in which $s_m(t)$ is substituted for $s_a(t)$ pursuant to the processing described above but, in reality, $s_a(t)$ would have been the better choice. For example, minor deviations between signals $s_a(t)$ and $s_m(t)$ are natural. However, if the threshold value is set too low, the difference between the two signals may lead to a determination that $s_m(t)$ be substituted for $s_a(t)$. Therefore, the threshold value should be established such that it is exceeded only if the difference between the two signals is "considerable." That is, the threshold value should be experimentally established—depending on such factors as, for example, channel and signal characteristics—at a "high level" such that the threshold is exceeded relatively infrequently. For instance, the threshold value may be such that the substitution of signal $s_m(t)$ is called for only at those times when the energy of the difference signal $(s_a(t)-s_m(t))$ is ten times that of the average energy of the difference signal $(s_a(t)-s_m(t))$ over a short time period.

There still remains, however, a possibility for "false alarms" even when the threshold value is set at a high level. For example, consider a musical selection in which at one point there is a sudden, loud cymbal clash If screening is always performed, the loud cymbal clash would likely cause a considerable difference to be found between its corresponding signal and the error mitigation signal it is compared with, the error mitigation signal having been generated based on the proximate prior audio coder frames that indicated no such discontinuous events in the music. Consequently, the screening would determine that errors undetected by the prior decoding and analysis processes were likely present, and the error mitigation signal would be substituted for the signal that corresponded to the symbol clash. Such being the case, the initial phase of the cymbal clash in the music unfortunately would not be heard by a listener.

Hence, in preferred embodiments, to lower the number of such false alarms, screening is not always performed. As mentioned earlier, screening may be suspended depending on signal statistics. It also may be "triggered" by the existence of a particular condition.

As an example, consider certain audio data transmission systems in which List Viterbi decoding is performed. Use of the List Viterbi algorithm in those systems has been shown to significantly reduce the so-called error flag rate over that which is exhibited by a system employing regular Viterbi decoding, resulting in a dramatic increase in audio quality.

However, the lower error flag rate also motivates the movement of such applications to noisier channels where the probability of undetected errors processed by the audio decoder increases. That increase in undetected errors is most likely attributable to those occurrences in which the first best candidate sequence identified by List Viterbi decoding does not satisfy the CRC. In these cases, some other sequence—identified by List Viterbi decoding when L>1—satisfies the CRC check and is determined to be acceptable. However, that sequence, which the List Viterbi algorithm found not to be the best, may in fact have errors that escaped detection by CRC decoding.

Accordingly, a condition that triggers screening when it is most advantageous in such systems may be the fact that the decoded sequence provided by analysis 134 to processing 135—and therefore the sequence that satisfied the CRC check—was not the first best candidate sequence identified by List Viterbi decoding. In FIG. 1, this trigger is illustratively a signal on lead 138. In addition to addressing the problem of false alarms, having such a trigger also provides for reduced average throughput delay.

Figure 3:
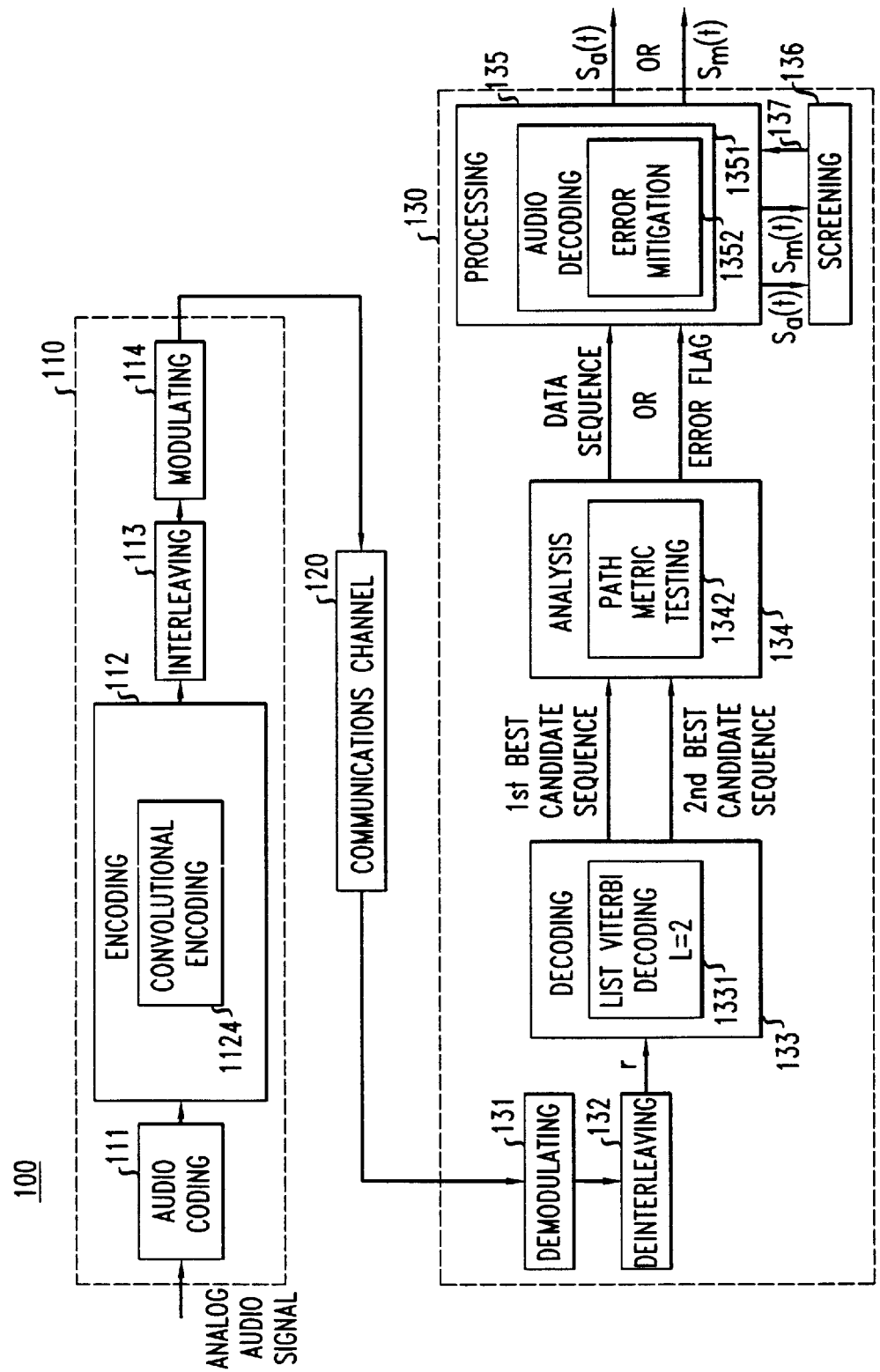
FIG. 3 shows a block diagram of a digital audio transmission system which includes a second illustrative embodiment of the invention, the system utilizing List Viterbi decoding and having an analysis step involving path metric testing.

The digital audio transmission system in FIG. 3 is similar to that of FIG. 1 except that CRC encoding is not performed. Moreover, List Viterbi decoding 1331 provides to analysis 134 in the first instance not only the best candidate sequence but also the second best candidate sequence (i.e., L=2). As is known in the art, every candidate sequence identified by Viterbi decoding has an associated so-called path metric. The best candidate sequence is that which has the best path metric and, in general, the path metric for the best candidate sequence should be significantly different from the path metric of the second best candidate sequence. Indeed, the presence of close alternative sequences, in terms of path metrics, to the best candidate sequence typically indicates a potential decoding error. Here, analysis 134 includes path metric testing 1342 which compares the difference of the path metrics associated with the two decoded sequences to a predetermined threshold value (normalized and possibly reflecting transmission conditions). If the difference is equal to or greater than the threshold value, the decoded sequence having the best path metric is provided to processing 135. If, on the other hand, the difference is less than the threshold value or, in other words, if the two path metrics are "too close", an error flag is released to processing 135. [For more information on path metric testing, see, for example, N. Seshadri and C-E. Sundberg, "List Viterbi Decoding Algorithms with Applications," *IEEE Transactions on Communications*, vol. 42, pp. 311–23, February/March/April 1994.] As in the arrangement of FIG. 1, processing 135 includes audio decoding 1351 which generates $s_a(t)$, the signal corresponding to the provided decoded sequence. In this arrangement, however, there is no trigger and thus the screening process—comparing $s_a(t)$ with error mitigation signal $s_m(t)$ as explained above—is always performed.

Figure 4:
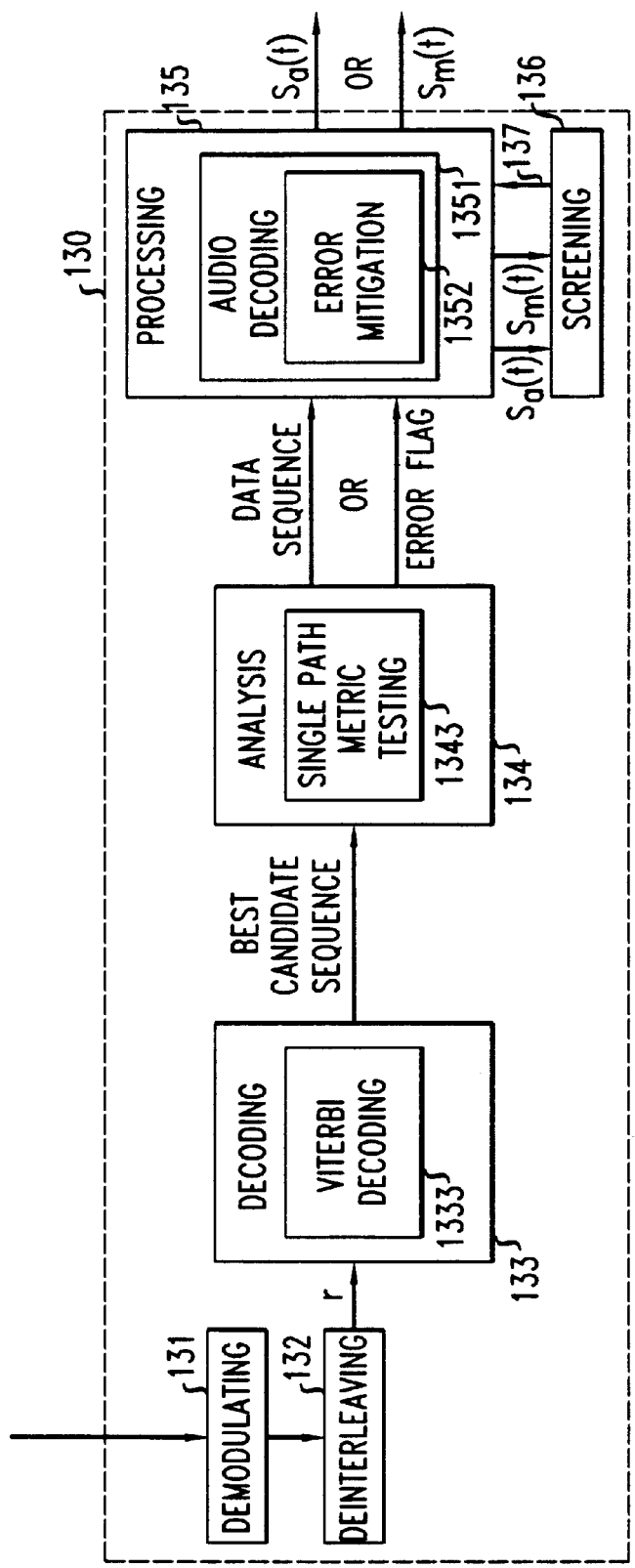
FIG. 4 shows a block diagram of a receiver for use in a digital audio transmission system which includes a third illustrative embodiment of the invention, the system utilizing regular Viterbi decoding is utilized and having an analysis step involving path metric testing.

The receiver in FIG. 4 is similar to the receiver shown in FIG. 3 except that decoding 133 comprises regular Viterbi decoding 1333 (i.e., L=1) and hence only one decoded sequence—the best sequence—is provided to analysis 134. Viterbi decoding 1333 illustratively uses a form of path metric computation in which the higher the path metric, the more reliable the sequence is determined to be, and indeed the best sequence is the sequence having the highest path metric. However, even though the best sequence has the highest path metric, that path metric may still not be high enough to warrant a determination that the sequence is free of significant errors. Therefore, analysis 134 includes single path metric testing 1343 that consists of comparing the path metric of the best sequence to a predetermined threshold value. An error flag is generated when the path metric is less than the threshold value; otherwise, the best sequence is provided to processing 135 and screening is performed as before.

Figure 5:
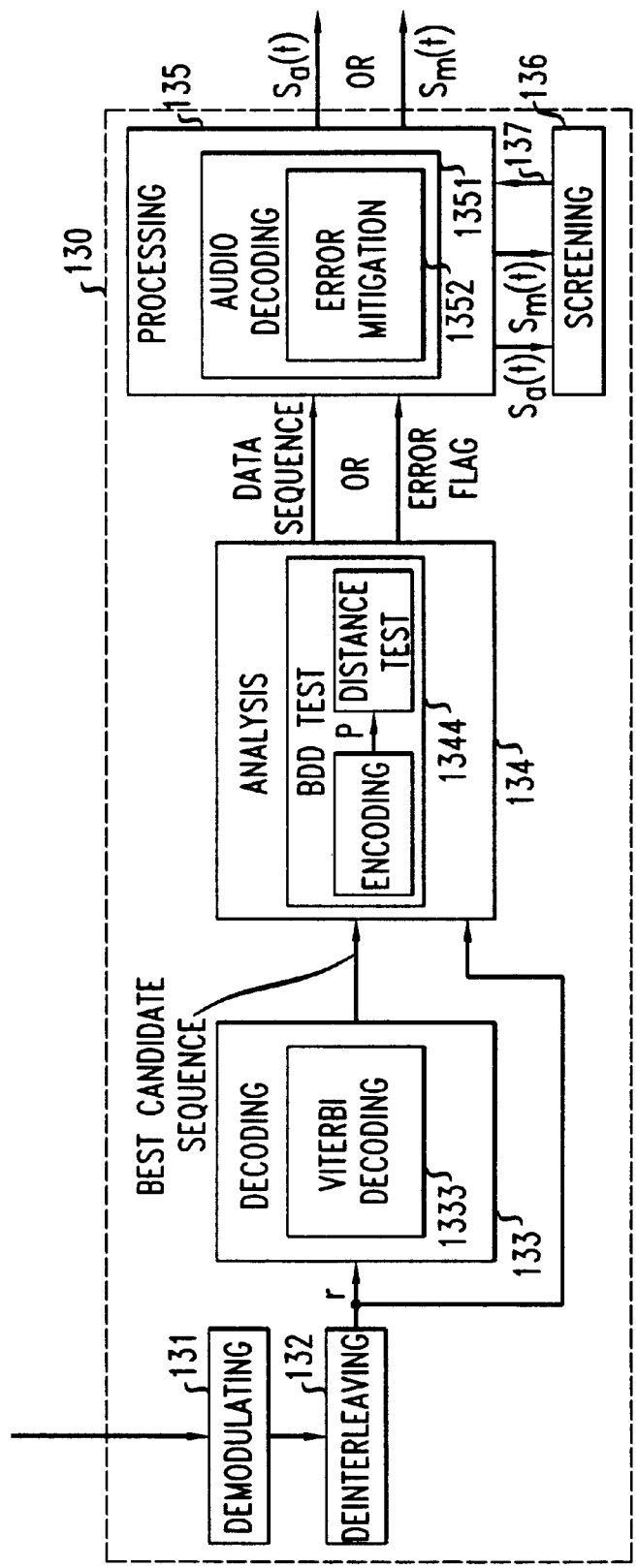
FIG. 5 shows a block diagram of a receiver for use in a digital audio transmission system which includes a fourth illustrative embodiment of the invention, the system utilizing regular Viterbi decoding and having an analysis step involving the so-called bounded distance decoder test.

Rather than the path metric testing as above, analysis 134 may include the so-called bounded distance decoder (BDD) test 1344, as shown in FIG. 5. As part of the BDD test, the decoded sequence provided by decoder 133 is re-encoded and thus a sequence of encoded symbols, p, is generated. The encoded symbols in sequence p are the best estimates, as determined by decoding 133, for the encoded symbols in the sequence, r, which is provided to decoding 133. In accordance with the BDD test, a determination of whether these best estimates are acceptable is made by comparing sequence p with sequence r, typically in terms of Euclidean or Hamming distance. In other words, what was actually received for decoding 133 is compared to the encoded equivalent of what was obtained by decoding 133. If the discrepancy is not greater than a predetermined threshold value, the decoded sequence is released to processing 135, and screening in which $s_a(t)$ is compared with error mitigation signal $s_m(t)$ is performed as before. Otherwise, an error flag is released.

Time discrete sampled versions, i.e., sequences r and p, were used above to describe the BDD test. However, sequence r can be thought of as a vector in signal space corresponding to a time continuous signal r(t). In accordance with standard communication theory, these representations—i.e., time discrete sampled and time continuous—are equivalent and are used interchangeably. The re-encoded sequence p is also a representation in the same signal space in which sequence r is a representation and has a corresponding time continuous signal p(t).

Thus, the BDD test may also be described in terms of the time continuous signals, r(t) and p(t). In particular, the BDD test can be of the type $$(\int (r(t)-p(t))^2 dt)^{1/2} > D_{e,min}/2-\epsilon$$

where integration is used to calculate squared Euclidean distance between the two signals, $D_{e,min}$ is the minimum Euclidean distance between coded symbol sequences over that integration interval and $\epsilon$ is a small correction term. (An energy normalization between r(t) and p(t) is also required.) According to the BDD test, if the above inequality is satisfied, an error flag is released.

Figure 6:
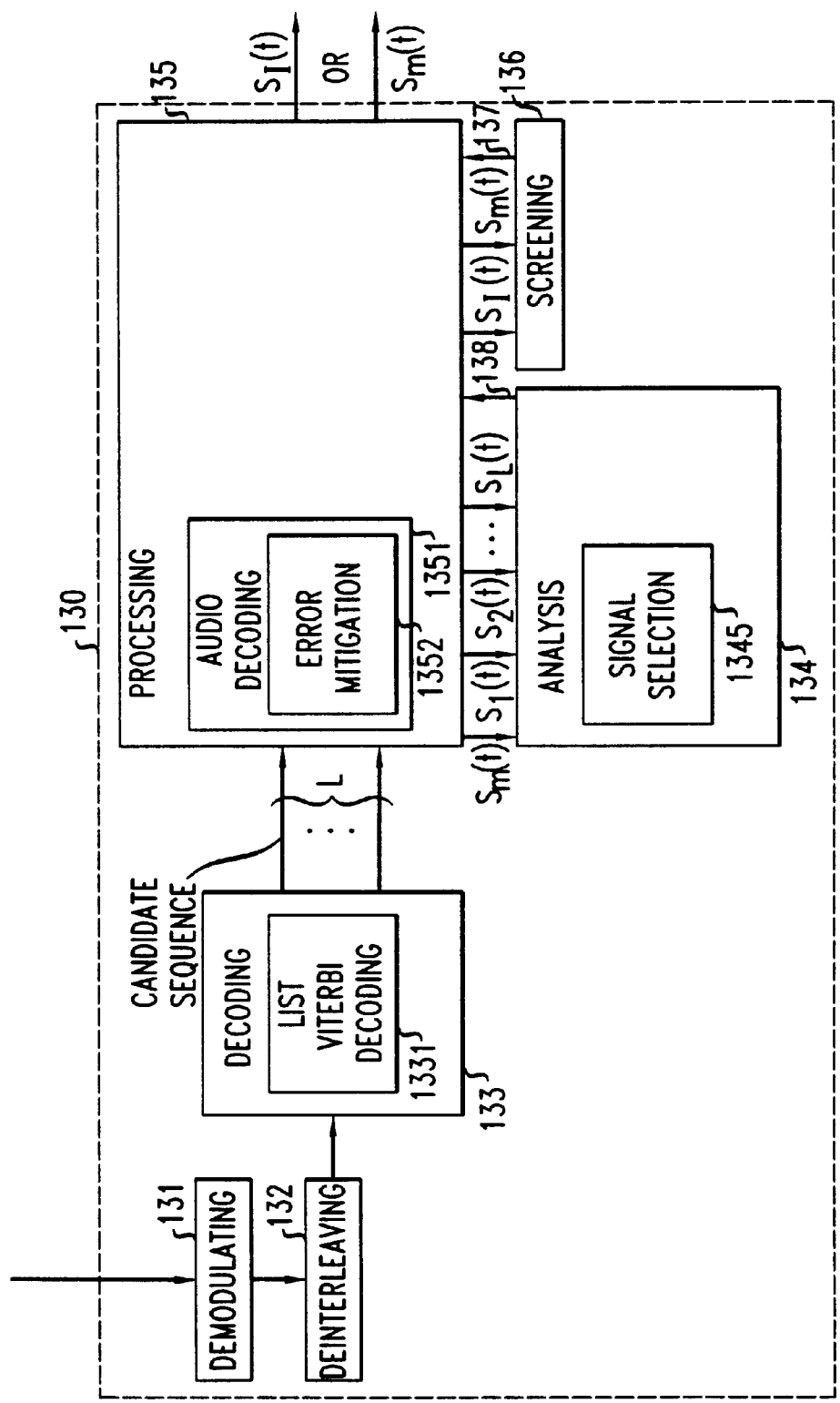
FIG. 6 shows a block diagram of a receiver for use in a digital audio transmission system which includes a fifth illustrative embodiment of the invention, the system utilizing List Viterbi decoding and the principles of the invention being utilized in the selection of a candidate decoding.

In particular embodiments such as those of FIGS. 1, 3–5, error screening undertaken pursuant to the present invention is performed after the results of an analysis are such that the decoded sequence is determined to be acceptable. However, error screening may be performed at any point after a decoded sequence is identified. Indeed, as in the arrangement of FIG. 6, error screening may be used to select one of several decoded sequences for processing. In particular, List Viterbi decoding 1331 provides the L best candidate decoding sequences to processing 135. Processing 135 includes audio decoding 1351 which generates signals $s_i(t)$, i=1,2, . . . L, corresponding respectively to the L best candidate sequences. The L signals $s_i(t)$ are provided to analysis 134. Analysis 134 is comprised of signal selection 1345 which compares each signal with error mitigation signal $s_m(t)$. Depending on the results of the comparison, signal selection 1345 indicates via lead 138 to processing 135 that either (a) a selected one of the L signals should be provided to screening 136 in the same manner as earlier described or (b) error mitigation signal $s_m(t)$ should be released.

The one of the L signals selected by signal selection 1345 is the signal that is determined to be most unlikely to contain significant errors. This determination may be made by finding the signal $s_i(t)$ that is "closest" to $s_m(t)$, for example, the signal that minimizes a parameter $D_i^2$ given by $$D_i^2 = \int (s_i(t)-s_m(t))^2 dt.$$

However, if there is at least one other signal $s_i(t)$ that is also "close" to $s_m(t)$, the likelihood of a decoding error increases since there should not be more than one signal that is acceptable. Therefore, in this case, all signals $s_i(t)$ are found likely to contain errors and error mitigation signal $s_m(t)$ is released. One way to determine if a signal other than $s_I(t)$—e.g., signal $s_J(t)$ having the next lowest value of $D_i^2$—is close to $s_m(t)$ is by determining whether for the signals, $s_I(t)$ and $s_J(t)$, the difference in their respective values of $D_i^2$ is less than a threshold value, $T_C$. That is, if $D_I^2 - D_J^2 < T_C$, where $J \neq I$, then error mitigation signal $s_m(t)$ is released.

If no other signal is "close" to $s_m(t)$, signal $s_I(t)$ is provided to screening 136 and error screening is performed as described above for the other arrangements. In this case, $D_I^2$, which is equal to $\int (s_I(t)-s_m(t))^2 dt$, is compared to threshold $T_T$. Thus, if $D_I^2$ is greater than $T_T$, screening 136 indicates via screening flag 137 that $s_m(t)$ should be released in place of $s_I(t)$.

The foregoing is to be understood as being exemplary and not restrictive. Indeed, the principles of the invention disclosed herein may be applicable to a wide range of so-called coded modulation systems.

Figure 7:
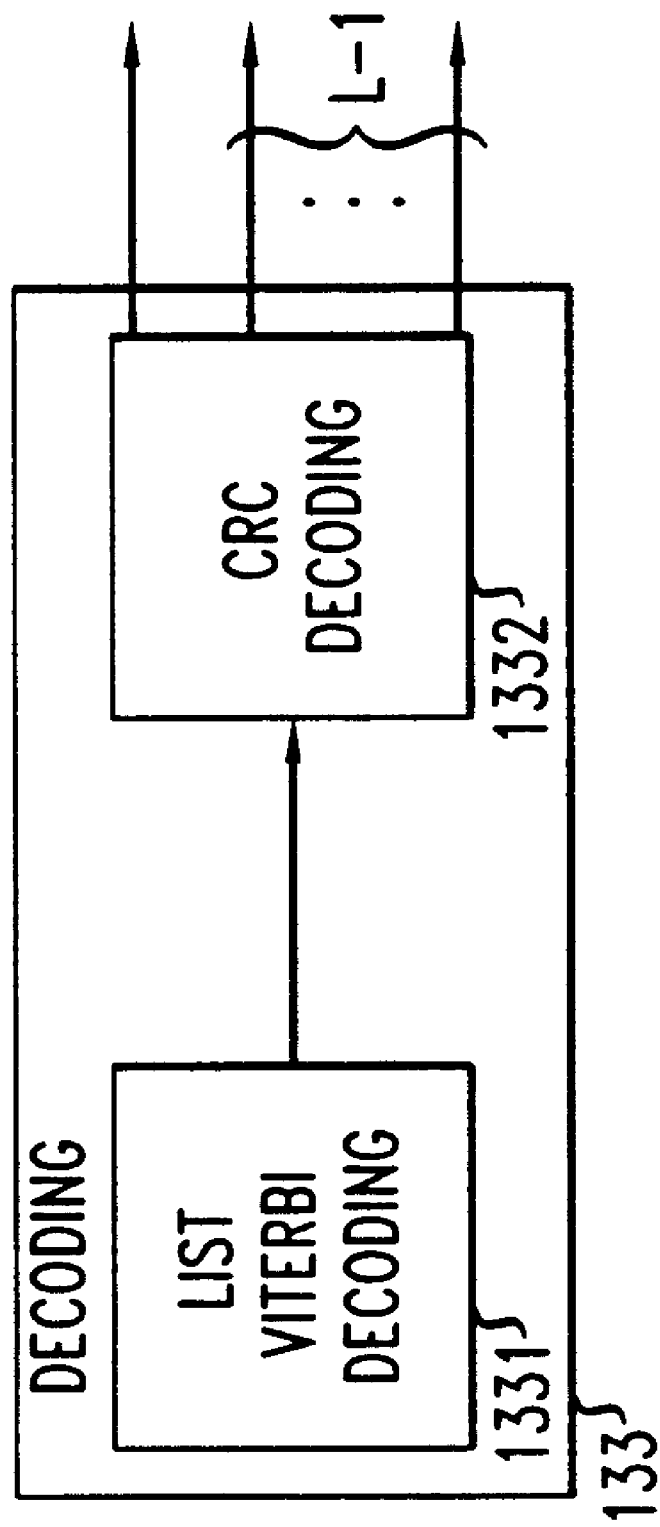
FIG. 7 shows a block diagram illustrating a concatenated decoding process.

In particular, in embodiments without an explicit CRC code, e.g., those in FIGS. 3–6, a CRC code may be employed wherein optimum decoding is provided for by a concatenation of a List Viterbi decoder and a CRC decoder. This concatenated decoding, or "super List Viterbi" decoding, is illustrated in FIG. 7. Specifically, responsive to candidate sequences provided by List Viterbi decoding 1331, CRC decoding 1332 outputs the L best candidate sequences, all of which satisfy the CRC.

It can be appreciated that the outer CRC code may be replaced by a Reed Solomon (RS) or other code. Moreover, although prediction and interpolation are widely known techniques to generate an error mitigation signal, any technique presently known or known in the future to generate an error mitigation signal may be used.

The diagrams herein represent conceptual views of functions embodying the principles of the invention and would, in preferred embodiments, be implemented by one or more programmed processors, digital signal processing (DSP) chips, or the like.

In the claims hereof any element expressed as a means for performing a specified function is intended to encompass any way of performing that function including, for example, a) a combination of circuit elements which performs that function or b) software in any form (including, therefore, firmware, microcode or the like) combined with appropriate circuitry for executing that software to perform the function.

The invention as defined by such claims resides in the fact that the functionalities provided by the various recited means are combined and brought together in the manner called for in the claims. Applicants thus regard any means which can provide those functionalities as equivalent to those shown herein.

It will be appreciated that those skilled in the art will be able to devise various arrangements which, although not explicitly shown or described herein, embody the principles of the invention and thus are within its spirit and scope.

We claim:

1. A method comprising the steps of
   receiving a sequence of symbols,
   generating a decoded data sequence corresponding to said received sequence, and
   determining a likelihood of significant errors in said decoded data sequence based on information extrinsic to and information intrinsic to said decoded data sequence.

2. The invention of claim 1 wherein said intrinsic information is said decoded sequence and/or a function of said decoded sequence and said extrinsic information is information exclusive of said decoded sequence.

3. The invention of claim 2 comprising the further step of applying said decoded data sequence to an output unless it is determined in said determining step that there is a likelihood of significant errors in said decoded data sequence.

4. The invention of claim 3 wherein said determining is performed only if a particular condition exists, the existence of said particular condition being indicative of an increased likelihood of significant errors in said decoded data sequence.

5. The invention of claim 4 wherein said particular condition is a function of said decoded data sequence.

6. The invention of claim 3 wherein said criterion is a function of an error mitigation signal and said decoded data sequence, said error mitigation signal being an estimate of a signal corresponding to said decoded data sequence.

7. The invention of claim 6 wherein said function includes comparing said error mitigation signal and said signal corresponding to said decoded data sequence, said likelihood being a function of said comparing.

8. The invention of claim 6 wherein said generating further includes the steps of
   List Viterbi decoding said sequence of symbols to generate a number of corresponding candidate data sequences, and
   selecting as said decoded data sequence one of said number of sequences.

9. The invention of claim 8 wherein said candidate data sequences have respective associated path metrics, and said selecting is a function of said path metrics.

10. The invention of claim 9 wherein said determining occurs only if a particular condition exists, the existence of said particular condition being indicative of an increased likelihood of significant errors in said decoded data sequence.

11. The invention of claim 8 wherein said selecting comprises the steps of
    generating a corresponding signal for each of said candidate sequences, and
    comparing each of said generated signals with said error mitigation signal, said selecting being a function of said comparing.

12. The invention of claim 11 wherein said determining occurs only if a particular condition exists, the existence of said particular condition being indicative of an increased likelihood of significant errors in said decoded data sequence.

13. The invention of claim 8 wherein said selecting includes the steps of
    ranking said number of candidate data sequences,
    performing at least one of a number of functions on at least one of said candidate data sequences, said functions being error detection, error correction, or a combination of error detection and error correction functions and said functions being solely intrinsic to said candidate data sequence, and
    forming a decision as to said selected one of said candidate data sequences as a function of the highest ranked candidate data sequence that satisfies said functions performed, said selected one being said decoded data sequence.

14. The invention of claim 13 wherein said at least one of a number of functions includes Cyclic Redundancy Check decoding.

15. The invention of claim 13 wherein said determining occurs only if a particular condition exists, the existence of said particular condition being indicative of an increased likelihood of significant errors in said decoded data sequence.

16. The invention of claim 14 wherein said particular condition is a function of the rank of said decoded data sequence resulting from said ranking of said number of candidate data sequences.

17. The invention of claim 7 wherein said determining occurs only if a particular condition exists, the existence of said particular condition being indicative of an increased likelihood of significant errors in said decoded data sequence.

18. The invention of claim 16 wherein said particular condition is a function of said decoded data sequence.

19. A method comprising the steps of
    generating a decoded data sequence corresponding to a received first signal,
    encoding said decoded data sequence to generate a corresponding second signal,
    forming a decision, as a function of said first signal and said second signal, as to whether a likelihood of significant errors in said decoded data sequence should be determined, and
    responsive to an affirmative such decision, determining said likelihood based on at least one criterion that is a function of both said decoded sequence and information exclusive of said decoded sequence, and applying said decoded data sequence to an output unless it is determined that there is a likelihood of significant errors.

20. A method comprising the steps of
    generating a decoded data sequence corresponding to a received sequence of symbols, said decoded data sequence having an associated path metric,
    forming a decision, as a function of said path metric, as to whether a likelihood of significant errors in said decoded data sequence should be determined, and
    responsive to an affirmative such decision, determining said likelihood based on at least one criterion that is a function of both said decoded sequence and information exclusive of said decoded sequence, and applying said decoded data sequence to an output unless it is determined that there is a likelihood of significant errors.

21. A method comprising the steps of receiving a sequence of symbols, generating a number of decoded data sequences corresponding to said received sequence, determining a likelihood of significant errors in at least one of said number of decoded data sequences based on at least one criterion that is both intrinsic and extrinsic to said respective decoded data sequence, and selecting and applying to an output one of said decoded data sequences unless it is determined that there is a likelihood of significant errors in said one of said decoded data sequences.

22. The invention of claim 21 wherein said determining includes, for at least one of said number of decoded data sequences, generating a first signal corresponding to said respective decoded data sequence, and generating a second signal as a function of information exclusive of said decoded data sequence, said at least one criterion being a function of said first signal and said second signal.

23. The invention of claim 22 wherein said second signal is an error mitigation signal, said error mitigation signal being an estimate of said first signal.

24. Apparatus comprising means for receiving a sequence of symbols, means for generating a decoded data sequence corresponding to said received sequence, and means for determining a likelihood of significant errors in said decoded data sequence based on at least one criterion that is both intrinsic and extrinsic to said decoded data sequence.

25. The invention of claim 24 further including means of applying said decoded data sequence if significant errors are determined not to be likely.

26. The invention of claim 25 wherein said at least one criterion is a function of both said decoded sequence and information exclusive of said decoded sequence.

27. Apparatus comprising means for generating a first signal corresponding to a decoded sequence of symbols, means for generating an error mitigation signal, said error mitigation signal being an estimate of said first signal, and means for determining a likelihood of significant errors in said decoded sequence as a function of a comparison between said error mitigation signal with said first signal.

28. The invention of claim 27 further comprising means for substituting as output said error mitigation signal for said first signal if said determining indicates that said substitution results in improved signal quality being output.

29. A method comprising the steps of receiving a decoded sequence of symbols, performing analysis on said decoded sequence to determine whether said decoded sequence is acceptable as correct, said analysis being a function solely of said decoded sequence, or solely of information exclusive of said decoded sequence, if said decoded sequence is determined to be acceptable, screening said decoded sequence to determine the likelihood of significant errors undetected by said analysis, said screening being a function of said decoded sequence and information exclusive of said decoded sequence, and applying said decoded sequence to an output unless said screening determined that there is a likelihood of undetected errors.

30. The invention of claim 29 wherein said screening includes generating a first signal as a function of said decoded sequence, generating a second signal, said second signal being an estimate of said first signal, and determining said likelihood as a function of said first signal and said second signal.

31. A method comprising the steps of receiving a number of decoded sequences of symbols, performing analysis on said decoded sequences to select one of said sequences, said analysis being a function (a) solely of said decoded sequence, (b) solely of information derivable from said decoded sequence, (c) solely of said decoded sequence and information derivable from said decoded sequence, or (d) solely of information exclusive of said decoded sequence, screening said selected decoded sequence to determine the likelihood of significant errors, said screening being a function of said decoded sequence and information exclusive of said decoded sequence, and applying said decoded sequence to an output unless said screening determined that there is a likelihood of significant errors.

32. The invention of claim 31 wherein said information exclusive of said decoded sequence is an error mitigation signal, said error mitigation signal being an estimate of a signal corresponding to said decoded data sequence.

33. A method comprising the steps of receiving a decoded sequence of symbols, performing analysis on said decoded sequence to determine whether said decoded sequence is acceptable as correct, said analysis being based on criteria that are either solely intrinsic or solely extrinsic to said decoded sequence, if said decoded sequence is determined to be acceptable, screening said decoded sequence to determine the likelihood of significant errors being undetected by said analysis, said screening being based on at least one criterion that is both extrinsic and intrinsic to said decoded sequence, and applying said decoded sequence to an output unless said screening determined that there is a likelihood of significant errors.

34. The invention of claim 33 wherein said screening includes generating a first signal as a function of said decoded sequence, generating a second signal, said second signal being an estimate of said first signal, and determining said likelihood as a function of said first signal and said second signal.

35. A method comprising the steps of receiving a decoded data sequence and a first signal corresponding to said decoded data sequence, generating an error mitigation signal, said error mitigation signal being an estimate of said first signal, and determining a likelihood of significant errors in said decoded data sequence as a function of said first signal and said error mitigation signals.

36. The invention of claim 35 comprising the further step of applying said decoded data sequence to an output unless it is determined in said determining step that there is a likelihood of significant errors.

37. The invention of claim 36 wherein said determining is performed only if a particular condition exists, the existence of said particular condition being indicative of an increased likelihood of significant errors in said decoded data sequence.

38. A method comprising the steps of receiving a decoded data sequence, receiving an error mitigation signal, said error mitigation signal being an estimate of a signal corresponding to said decoded data sequence, and determining a likelihood of significant errors in said decoded data sequence as a function of said decoded data sequence and said error mitigation signal.

39. The invention of claim 38 comprising the further step of, applying said error mitigation signal to an output unless it is determined in said determining step that there is a likelihood of significant errors.

40. The invention of claim 39 wherein said determining is performed only if a particular condition exists, the existence of said particular condition being indicative of an increased likelihood of significant errors in said decoded data sequence.

\* \* \* \* \*